(12) United States Patent
Hou et al.

(10) Patent No.: US 12,477,652 B2
(45) Date of Patent: Nov. 18, 2025

(54) CIRCUIT DEVICE

(71) Applicant: AUO Corporation, Hsin-Chu (TW)

(72) Inventors: Chun-Yueh Hou, Hsin-Chu (TW);
Hao-An Chuang, Hsin-Chu (TW);
Hsi-Hung Chen, Hsin-Chu (TW)

(73) Assignee: AUO CORPORATION, Hsin-Chu (TW)

( * ) Notice: Subject to any disclaimer, the term of this patent is extended or adjusted under 35 U.S.C. 154(b) by 205 days.

(21) Appl. No.: 18/535,247

(22) Filed: Dec. 11, 2023

(65) Prior Publication Data
US 2024/0306294 A1    Sep. 12, 2024

(30) Foreign Application Priority Data

Mar. 8, 2023   (TW) ................................. 112108591

(51) Int. Cl.
*H05K 1/09*     (2006.01)
*H05K 3/28*     (2006.01)
*H10H 29/14*    (2025.01)

(52) U.S. Cl.
CPC .............. *H05K 1/092* (2013.01); *H05K 3/28* (2013.01); *H10H 29/142* (2025.01); *H05K 2201/10128* (2013.01); *H05K 2203/1377* (2013.01)

(58) Field of Classification Search
CPC .......... H05K 2201/09181; H05K 2201/09145; H05K 2201/09154; H05K 1/092; H05K 1/117; H01L 25/167; H01L 25/0753; H10H 20/857; H10H 20/0364; H10D 86/60; H10D 86/0212
See application file for complete search history.

(56) References Cited

U.S. PATENT DOCUMENTS 6,277,745 B1    8/2001  Liu et al.
11,805,687 B2 * 10/2023  Jeong .................... H01L 25/105
(Continued)

FOREIGN PATENT DOCUMENTS

TW    201913332 A    4/2019
TW    I676839 B      11/2019
TW    I775506 B      8/2022

OTHER PUBLICATIONS

Office Action issue by (TIPO) Taiwan Intellectual Property Office Ministry of Economic Affairs R.O.C., Mar. 19, 2024, for Application No. 112108591, Tawian.

*Primary Examiner* — Roshn K Varghese
(74) *Attorney, Agent, or Firm* — Tim Tingkang Xia, Esq.; Troutman Pepper Locke LLP

(57) ABSTRACT

A circuit device includes a circuit substrate, a protective layer and a side trace. The circuit substrate has a first surface, a second surface opposite to the first surface, and a side surface. A first turning region is provided between the first surface and the side surface. A second turning region is provided between the second surface and the side surface. The circuit substrate includes a carrier plate and a first circuit structure. The first circuit structure is located on the carrier plate, and includes a pad located on the first surface. The protective layer at least partially covers the first turning region and the second turning region. A material of the protective layer includes cured silver paste, epoxy resin or an acrylic-based insulating material. The side trace is located on the protective layer, and extends from the pad across the side surface to the second surface.

9 Claims, 19 Drawing Sheets

(56) References Cited

U.S. PATENT DOCUMENTS

| | | | |
|---|---|---|---|
| 12,279,378 B2* | 4/2025 | Hasegawa | H01L 23/12 |
| 2001/0035582 A1 | 11/2001 | Tesauro et al. | |
| 2008/0296591 A1 | 12/2008 | Lin et al. | |
| 2015/0008429 A1 | 1/2015 | Ito et al. | |
| 2016/0351092 A1 | 12/2016 | Chen et al. | |
| 2018/0192521 A1 | 7/2018 | Shpaisman et al. | |

* cited by examiner

CIRCUIT DEVICE

CROSS-REFERENCE TO RELATED PATENT APPLICATION

This non-provisional application claims priority to and the benefit of, pursuant to 35 U.S.C. § 119(a), patent application Serial No. 112108591 filed in Taiwan on Mar. 8, 2023. The disclosure of the above application is incorporated herein in its entirety by reference.

Some references, which may include patents, patent applications and various publications, are cited and discussed in the description of this disclosure. The citation and/or discussion of such references is provided merely to clarify the description of the present disclosure and is not an admission that any such reference is "prior art" to the disclosure described herein. All references cited and discussed in this specification are incorporated herein by reference in their entireties and to the same extent as if each reference were individually incorporated by reference.

FIELD

The present disclosure relates to a circuit device.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

To meet market demands, an increasing number of manufacturers are devoted to developing display panels with narrow borders or even borderless designs. Generally, in order to reduce the area of the border region of the display panel, the chips or film-on-chip packaging structures are disposed on the back surface or side surfaces of the display panel, for example, by connecting a flexible circuit board to the pads on the front surface of the display panel, and then bending the flexible circuit board to the back surface of the display panel. However, due to the relatively greater thickness of the flexible circuit board itself and the difficulty in completely conforming the flexible circuit board to the side surface of the display panel, it is challenging to further minimize the area of the border region of the display panel.

SUMMARY

The present disclosure provides a circuit device, which enhances the yield of the side trace by providing a protective layer.

At least one embodiment of the present disclosure provides a circuit device. The circuit device includes a circuit substrate, a protective layer and a side trace. The circuit substrate has a first surface, a second surface opposite to the first surface, and a side surface. A first turning region is provided between the first surface and the side surface. A second turning region is provided between the second surface and the side surface. The circuit substrate includes a carrier plate and a first circuit structure. The first circuit structure is located on the carrier plate, and includes a pad located on the first surface of the circuit substrate. The protective layer at least partially covers the first turning region and the second turning region. A material of the protective layer includes cured silver paste, epoxy resin or an acrylic-based insulating material. The side trace is located on the protective layer, and extends from the pad across the side surface of the circuit substrate to the second surface of the circuit substrate.

These and other aspects of the present disclosure will become apparent from the following description of the preferred embodiment taken in conjunction with the following drawings, although variations and modifications therein may be effected without departing from the spirit and scope of the novel concepts of the disclosure.

BRIEF DESCRIPTION OF THE DRAWINGS

The accompanying drawings illustrate one or more embodiments of the disclosure and together with the written description, serve to explain the principles of the disclosure. Wherever possible, the same reference numbers are used throughout the drawings to refer to the same or like elements of an embodiment, and wherein.

DETAILED DESCRIPTION

FIG. 1A, FIG. 2A, FIG. 3A, FIG. 4A, FIG. 5A and FIG. 6A are sectional schematic views of a manufacturing method of a circuit device according to one embodiment of the present disclosure. FIG. 1B, FIG. 2B, FIG. 3B, FIG. 4B, FIG. 5B and FIG. 6B are side schematic views of the manufacturing method of the circuit device in FIG. 1A, FIG. 2A, FIG. 3A, FIG. 4A, FIG. 5A and FIG. 6A, respectively. FIG. 1C, FIG. 2C, FIG. 3C, FIG. 4C, FIG. 5C and FIG. 6C are top schematic views of the manufacturing method of the circuit device in FIG. 1A, FIG. 2A, FIG. 3A, FIG. 4A, FIG. 5A and FIG. 6A, respectively.

Figure 1A:
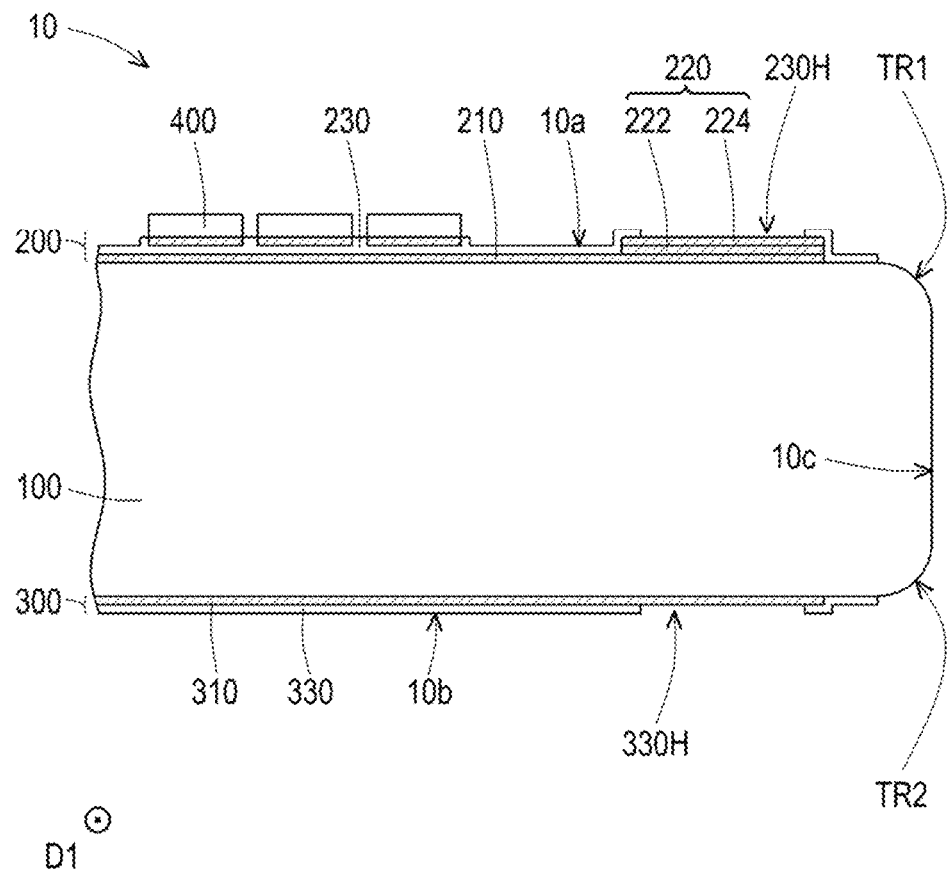
FIG. 1A, FIG. 2A, FIG. 3A, FIG. 4A, FIG. 5A and FIG. 6A are sectional schematic views of a manufacturing method of a circuit device according to one embodiment of the present disclosure.
Figure 1B:
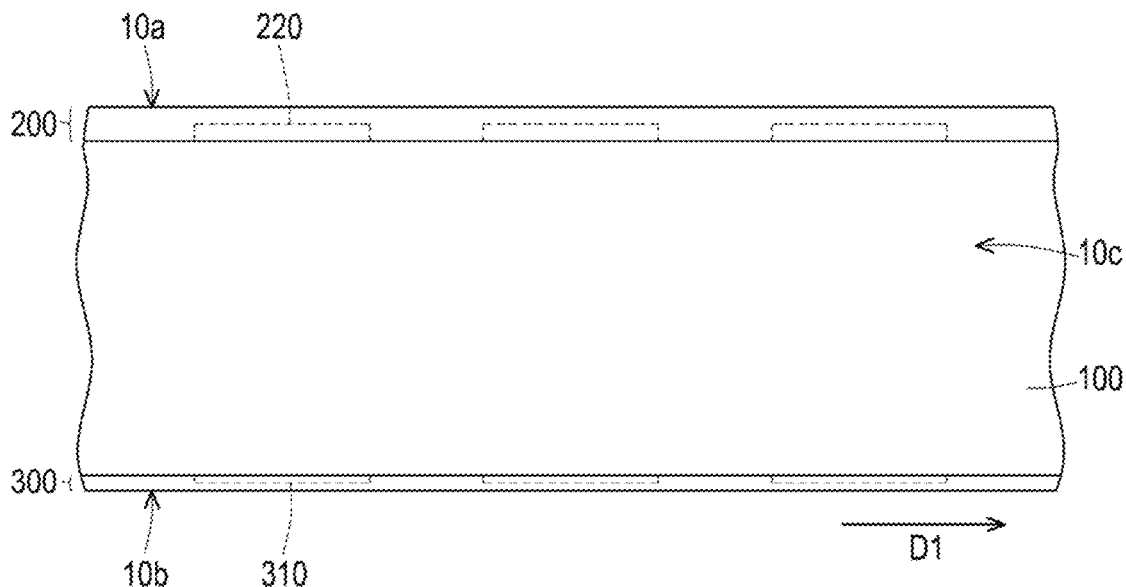
FIG. 1B, FIG. 2B, FIG. 3B, FIG. 4B, FIG. 5B and FIG. 6B are side schematic views of the manufacturing method of the circuit device in FIG. 1A, FIG. 2A, FIG. 3A, FIG. 4A, FIG. 5A and FIG. 6A.
Figure 1C:
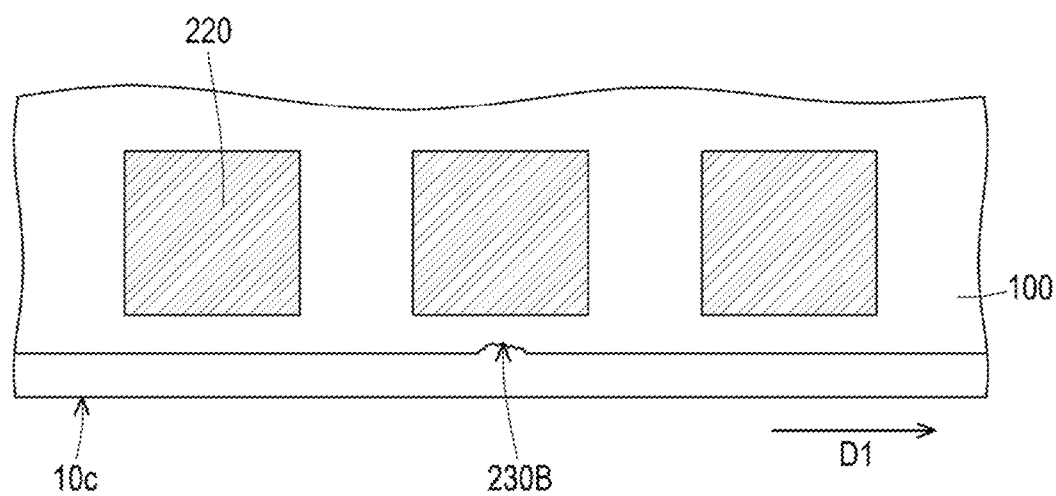
FIG. 1C, FIG. 2C, FIG. 3C, FIG. 4C, FIG. 5C and FIG. 6C are top schematic views of the manufacturing method of the circuit device in FIG. 1A, FIG. 2A, FIG. 3A, FIG. 4A, FIG. 5A and FIG. 6A.

Referring to FIG. 1A, FIG. 1B and FIG. 1C, a circuit substrate 10 is provided. The circuit substrate 10 has a first surface 10*a*, a second surface 10*b* opposite to the first surface 10*a*, and a side surface 10*c*. A first turning region TR1 is provided between the first surface 10a and the side surface 10c, and a second turning region TR2 is provided between the second surface 10b and the side surface 10c. In the present embodiment, the first turning region TR1 and the second turning region TR2 include round corners, but the present disclosure is not limited thereto. In other embodiments, the first turning region TR1 and the second turning region TR2 include right angles or oblique surfaces. In certain embodiments, the side surface 10c of the circuit substrate 10, the first turning region TR1 and the second turning region TR2 are formed by a grinding process. The grinding process may reduce the size of the border region of the circuit substrate 10, thus further reducing the size of the device. In certain embodiments, the grinding process makes the side surface 10c of the circuit substrate 10 (which may also be referred to as a side surface of a carrier plate 100) to generate a microcrack, such that the side surface of the carrier plate 100 is rougher than a front surface and a back surface of the carrier plate 100.

The circuit substrate 10 includes the carrier plate 100, a first circuit structure 200 and a second circuit structure 300. The first circuit structure 200 is located on the front surface of the carrier plate 100, and the second circuit structure 300 is located on the back surface of the carrier plate 100. In certain embodiments, a material of the carrier plate 100 may be glass, quartz, organic polymers or opaque/reflective materials (for example, conductive materials, metals, wafers, ceramics or other suitable materials) or other suitable materials. When the conductive materials or metals are used, the carrier plate 100 is covered by an insulating layer (not illustrated) to avoid short-circuiting.

The first circuit structure 200 includes a signal line 210, a pad 220 and an insulating structure 230. The pad 220 is located on the first surface 10a of the circuit substrate 10, and is electrically connected to the signal line 210. The pad 220 includes a single-layered or multi-layered structure. For example, the pad 220 includes a first conductive layer 222 and a second conductive layer 224 sequentially stacked. In the present embodiment, the first circuit structure 200 includes a plurality of signal lines 210 and a plurality of pads 220, and each pad 220 is electrically connected to a corresponding one of the signal lines 210.

In the present embodiment, the insulating structure 230 surrounds the pad 220, and the insulating structure 230 has an opening 230H overlapping with the pad 220. The insulating structure 230 includes a single-layered or multi-layered structure, and covers the signal lines 210. In certain embodiments, the insulating structure 230 includes a multi-layered structure, and a portion of the insulating structure 230 extends to be between the first conductive layer 222 and the second conductive layer 224. In the present embodiments, the pads 220 are arranged in a first direction D1, and a plurality of openings 230H are arranged in the first direction D1.

In the present embodiment, when performing the grinding process to form the side surface 10c, the first turning region TR1 and the second turning region TR2, a portion of the insulating structure 230 may be damaged and generate a broken surface 230B. The broken surface 230B is located between the pad 220 and the side surface 10c of the circuit substrate 10. In certain embodiments, the broken surface 230B is not a flat surface. In certain embodiments, the broken surface 230B is an irregular surface.

The second circuit structure 300 includes a signal line 310 and an insulating structure 330. A portion of the signal line 310 is located on the second surface 10b of the circuit substrate 10. The insulating structure 330 covers the signal line 310, and has an opening 330H overlapping with the signal line 310. In the present embodiment, the second circuit structure 300 includes a plurality of signal lines 310. In the present embodiment, the signal lines 310 are arranged in the first direction D1, and the openings 330H are arranged in the first direction D1. In certain embodiments, when performing the grinding process to form the side surface 10c, the first turning region TR1 and the second turning region TR2, a portion of the insulating structure 330 may also be damaged and generate a broken surface (not illustrated).

In certain embodiments, the materials of the insulating structure 230 and the insulating structure 330 include silicon oxide, silicon nitride, silicon oxynitride, aluminum oxide, hafnium oxide, zirconium oxide or a combination thereof. In certain embodiments, the materials of the signal line 210, the pad 220 and the signal line 310 include metals, metal oxide, metal nitride or other conductive materials.

In certain embodiments, the circuit substrate 10 further includes a plurality of light emitting components 400. The light emitting components 400 are disposed on the first circuit structure 200. In certain embodiments, the light emitting components 400 are electrically connected to the pads 220. In certain embodiments, the light emitting components 400 include miniature light-emitting diodes (LEDs), micro LEDs or other types of light emitting components.

Figure 2A:
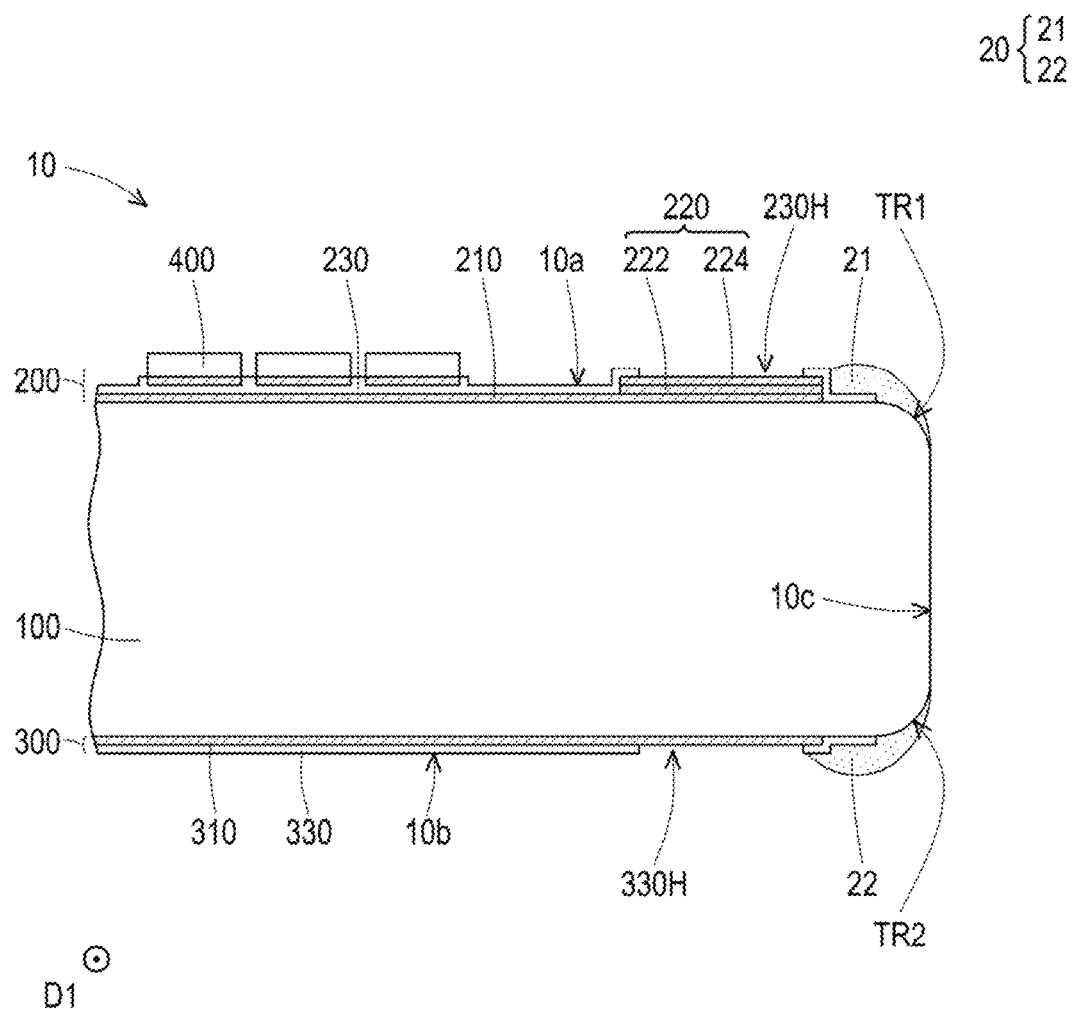
Figure 2B:
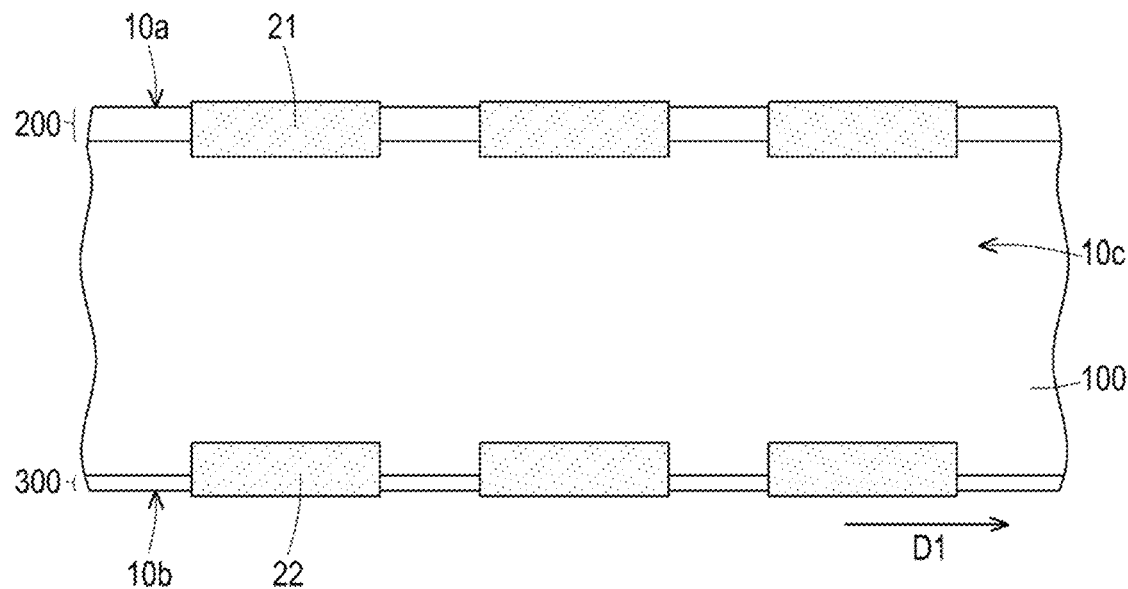
Figure 2C:
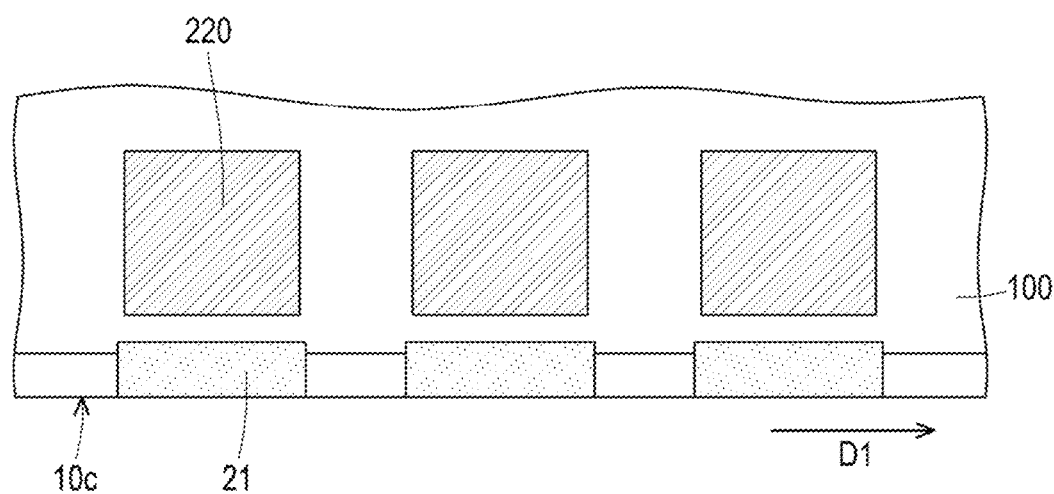

Referring to FIG. 2A, FIG. 2B and FIG. 2C, a protective layer 20 is formed on the circuit substrate 10. In the present embodiment, the protective layer 20 is formed on the circuit substrate 10. The protective layer 20 at least partially covers the first turning region TR1 and the second turning region TR2. In the present embodiment, a plurality of protective layers 20 are arranged in the first direction D1.

In the present embodiment, the protective layers 20 are separated from each other, and each protective layer 20 includes a first portion 21 and a second portion 22 separated from each other. The first portion 21 covers the first turning region TR1, and the second portion 22 covers the second turning region TR2. In certain embodiments, the method of forming the protective layers 20 includes transfer printing, coating or other suitable methods. In certain embodiments, a material of the protective layers 20 is different from the material of the insulating structure 230 and the insulating structure 330, and the material of the protective layers 20 includes cured silver paste, epoxy resin or an acrylic-based insulating material.

In certain embodiments, the protective layers 20 cover a portion of the first circuit structure 200 and a portion of the second circuit structure 300. In the present embodiment, the protective layers 20 are not filled in the openings 230H and the openings 330H. In other embodiments, the protective layers 20 are filled in the corresponding openings 230H and/or the corresponding openings 330H, and contact the corresponding pads 220 and/or the corresponding signal lines 310. For example, the first portion 21 of each protective layer 20 is filled in the corresponding opening 230H and contacts the corresponding pad 220; and the second portion 22 of each protective layer 20 is filled in the corresponding opening 330H and contacts the corresponding signal line 310.

In the present embodiment, the protective layers 20 cover the broken surface 230B of the insulating structure 230, thus reducing the ill effect caused by the broken surface 230B to the subsequent manufacturing process. In certain embodiments, the protective layer 20 is filled in the notch of the insulating structure 230 corresponding to the broken surface 230B. In certain embodiments, the protective layer 20 extends from the upper surface of the insulating structure 230 to the carrier plate 100 along the broken surface 230B, and the protective layer 20 contacts the carrier plate 100.

Figure 3A:
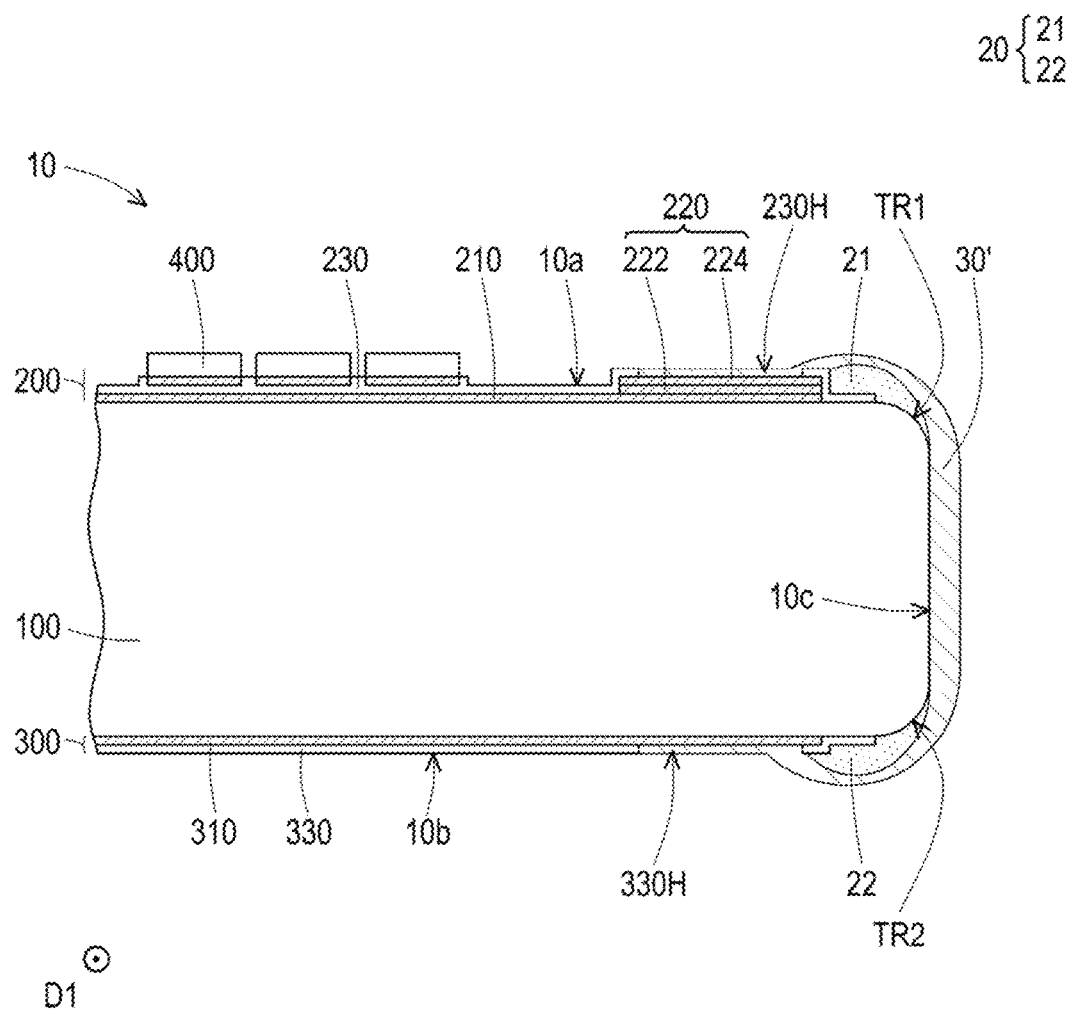
Figure 3B:
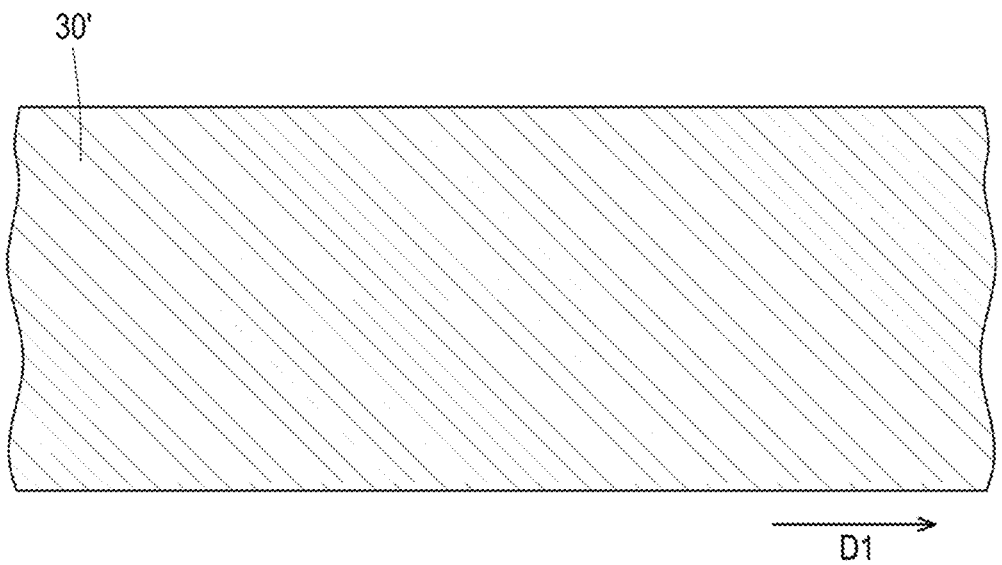
Figure 3C:
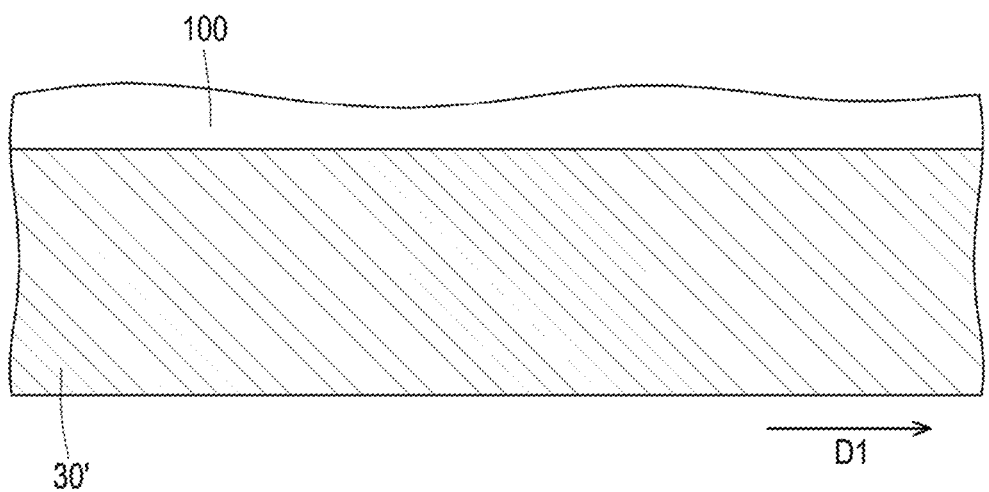

Referring to FIG. 3A, FIG. 3B and FIG. 3C, a conductive material 30' is formed on the side surface 10c of the circuit substrate 10. The conductive material 30' extends from the first surface 10a of the circuit substrate 10 across the side surface 10c of the circuit substrate 10 to the second surface 10b of the circuit substrate 10. The conductive material 30' covers the first portion 21 and the second portion 22 of the protective layer 20. The conductive material 30' is at least partially filled in the opening 230H of the insulating structure 230 and the opening 330H of the insulating structure 330. The conductive material 30' contacts the pad 220 and the signal line 310.

In certain embodiments, the method of forming the conductive material 30' includes a sputtering process. In certain embodiments, a material of the conductive material 30' includes copper, molybdenum, silver, gold, aluminum, titanium, nickel, chromium and other suitable metal or a combination of the aforementioned materials. In certain embodiments, the conductive material 30' includes a single-layered or multi-layered structure.

The protective layer 20 covers the broken surface 230B of the insulating structure 230, thus avoiding the ill effect caused by the broken surface 230B to the conductive material 30'. In certain embodiments, an adhesion between the conductive material 30' and the protective layer 20 is greater than an adhesion between the conductive material 30' and the insulating structure 230 and an adhesion between the conductive material 30' and the insulating structure 330. Thus, by providing the protective layer 20, the probability of delamination of the conductive material 30' may be reduced. In certain embodiments, by performing a cross-cut test on the stack structure of the carrier plate 100 (e.g., glass), the insulating structure 230 (e.g., silicon nitride), the protective layer 20 (e.g., phenolic resin, epoxy resin or an acrylic-based material) and the conductive material 30' (e.g., a stack layer of molybdenum, copper and molybdenum), the adhesion of the conductive material 30' may be obtained as 5B.

Figure 4A:
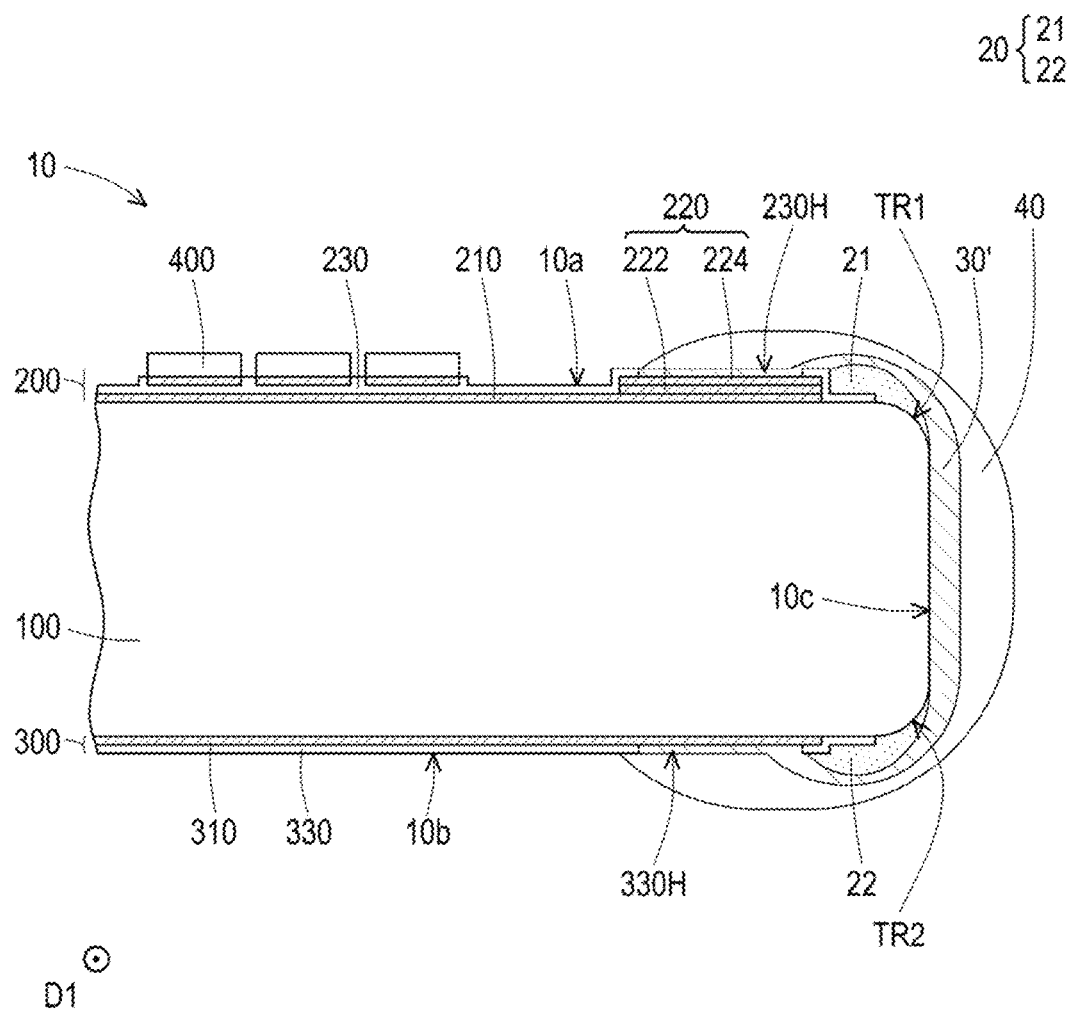
Figure 4B:
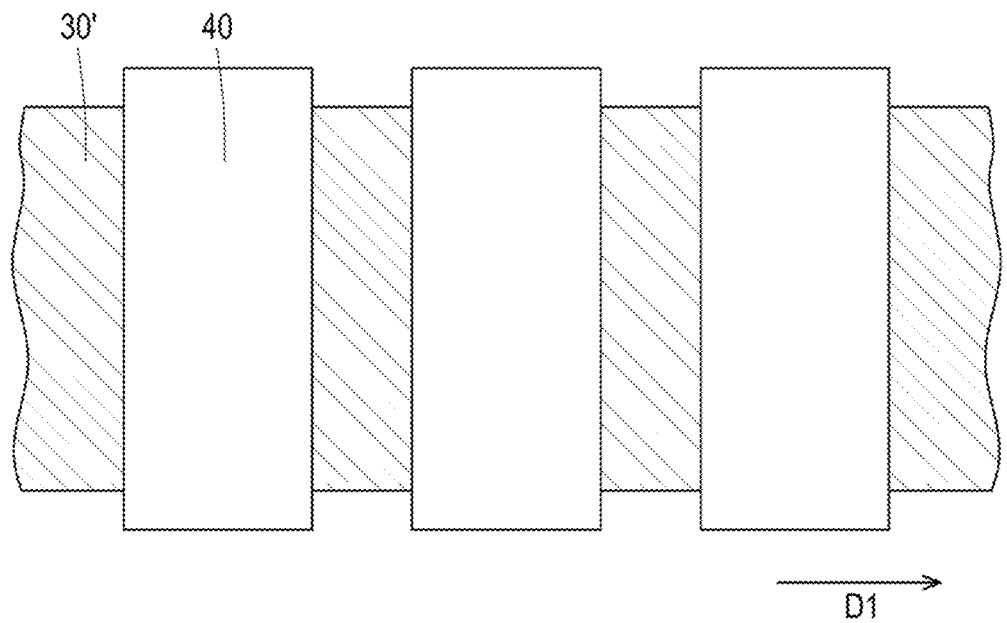
Figure 4C:
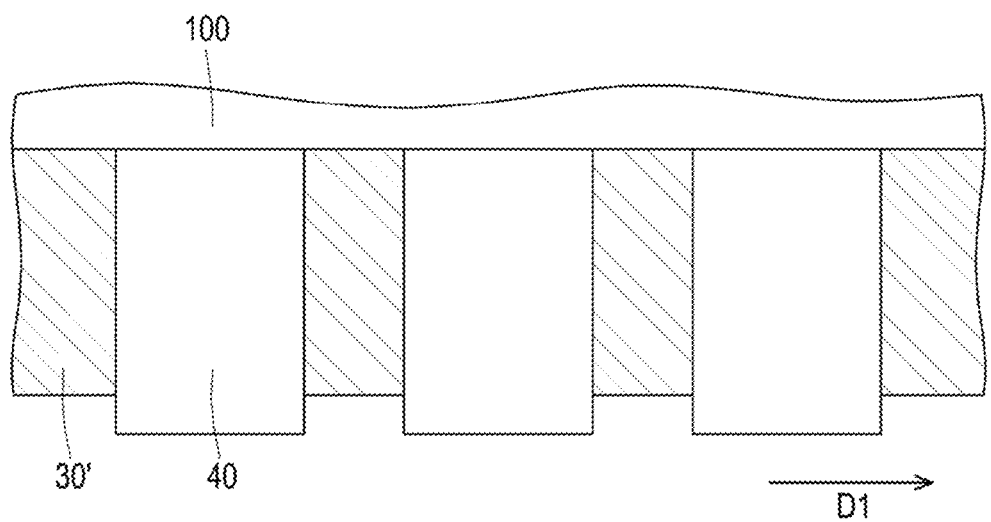

Referring to FIG. 4A, FIG. 4B and FIG. 4C, a first covering layer 40 is formed on the conductive material 30'. The first covering layer 40 extends from the first surface 10a of the circuit substrate 10 across the side surface 10c of the circuit substrate 10 to the second surface 10b of the circuit substrate 10. Each first covering layer 40 overlaps with the corresponding opening 230H and the corresponding opening 330H. In the present embodiment, a plurality of first covering layers 40 are formed, and the first covering layers 40 are arranged in the first direction D1.

In certain embodiments, the method of forming the first covering layers 40 includes transfer printing, coating or other suitable methods. In certain embodiments, the material of the first covering layers 40 includes epoxy resin, phenolic resin, an acrylic-based insulating material or other suitable insulating materials.

Figure 5A:
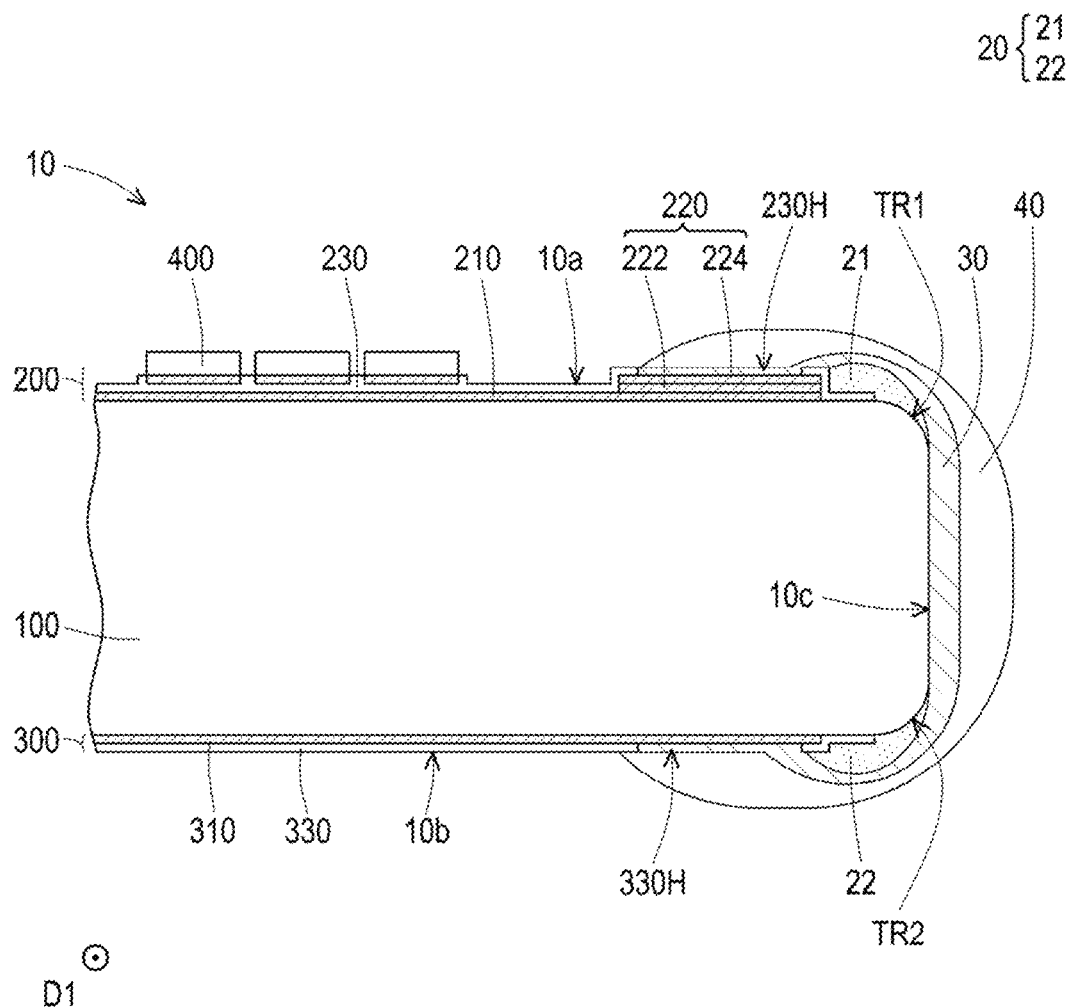
Figure 5B:
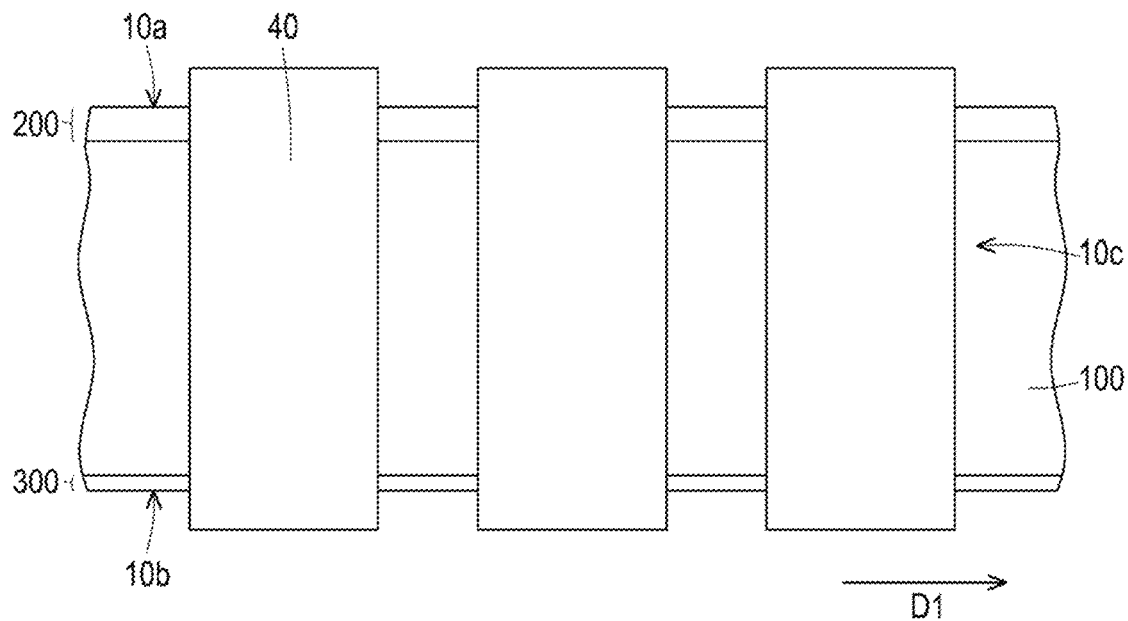
Figure 5C:
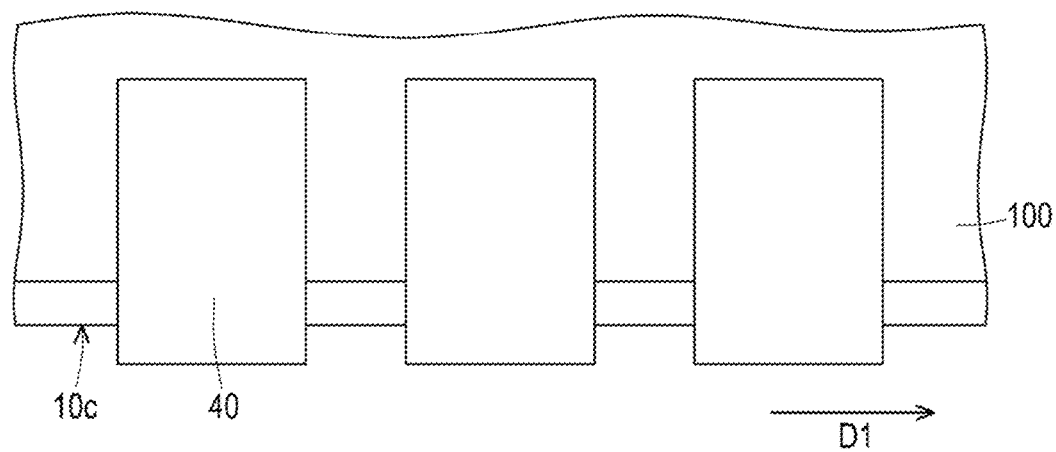

Referring to FIG. 5A, FIG. 5B and FIG. 5C, the conductive material 30' is etched using the first covering layers 40 as the mask to form side traces 30. In certain embodiments, a plurality of side traces 30 are arranged in the first direction D1.

In certain embodiments, the method of etching the conductive material 30' includes a wet etching process. For example, the conductive material 30' is etched by an etching solution to form the side traces 30. In certain embodiments, a resistance of the first covering layers 40 and the protective layers 20 to the etching solution is greater than a resistance of the side traces 30 to the etching solution. Thus, the first covering layers 40 and the protective layers 20 may protect the side traces 30 in the wet etching process.

Each first covering layer 40 covers the corresponding side trace 30. Each side trace 30 is located on a corresponding one of the protective layers 20, and extends from the pad 220 across the side surface 10c of the circuit substrate 10 to the second surface 10b of the circuit substrate 10. The side traces 30 are at least partially filled in the openings 230H to contact the pads 220, and the side traces 30 are at least partially filled in the openings 330H to contact the signal lines 310. In other words, the pads 220 are electrically connected to the signal lines 310 through the side traces 30.

Figure 6A:
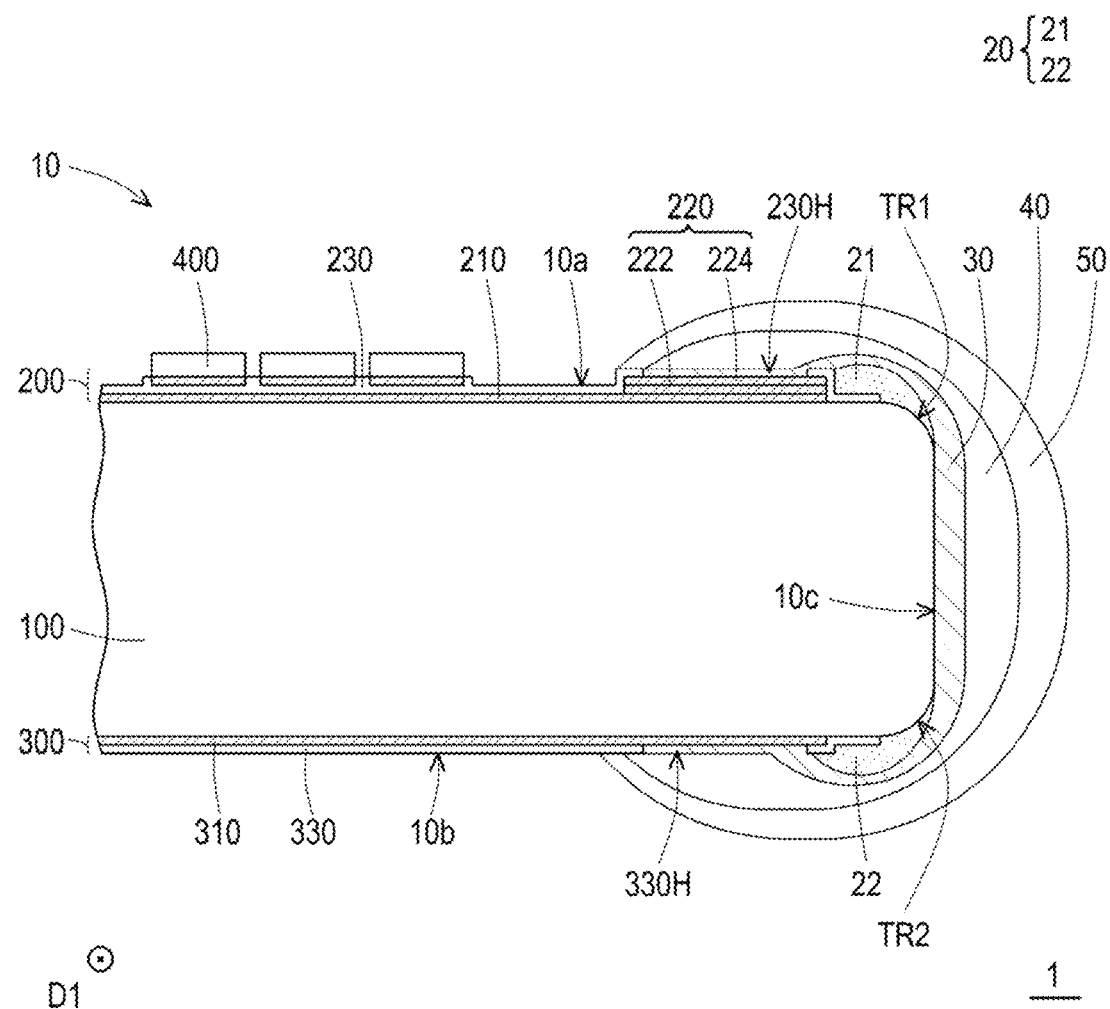
Figure 6B:
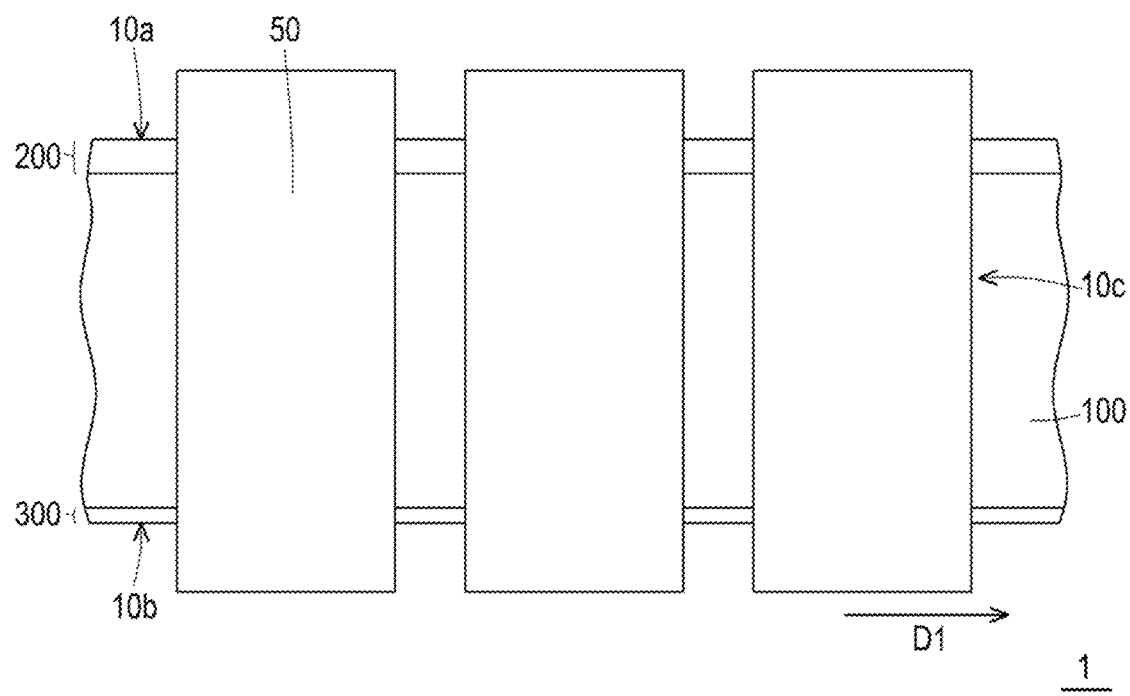
Figure 6C:
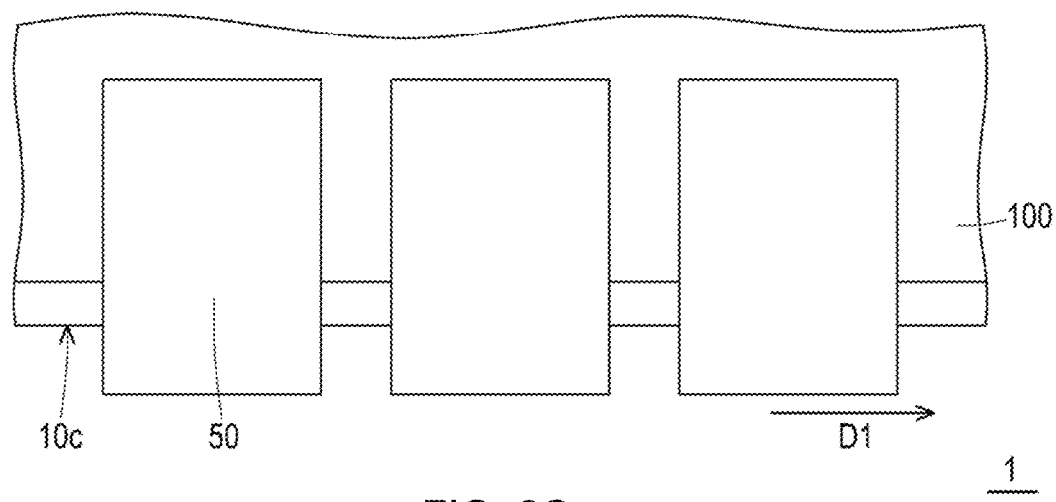

Referring to FIG. 6A, FIG. 6B and FIG. 6C, a plurality of second covering layers 50 are formed on the first covering layers 40. Each second covering layer 50 covers the corresponding first covering layer 40.

In certain embodiments, the method of forming the second covering layers 50 includes transfer printing, coating or other suitable methods. In certain embodiments, the material of the second covering layers 50 includes black resin or other acrylic-based materials.

At this point, the circuit device 1 is substantially complete. The circuit device 1 includes the circuit substrate 10, the protective layers 20, the side traces 30, the first covering layers 40 and the second covering layers 50.

Figure 7A:
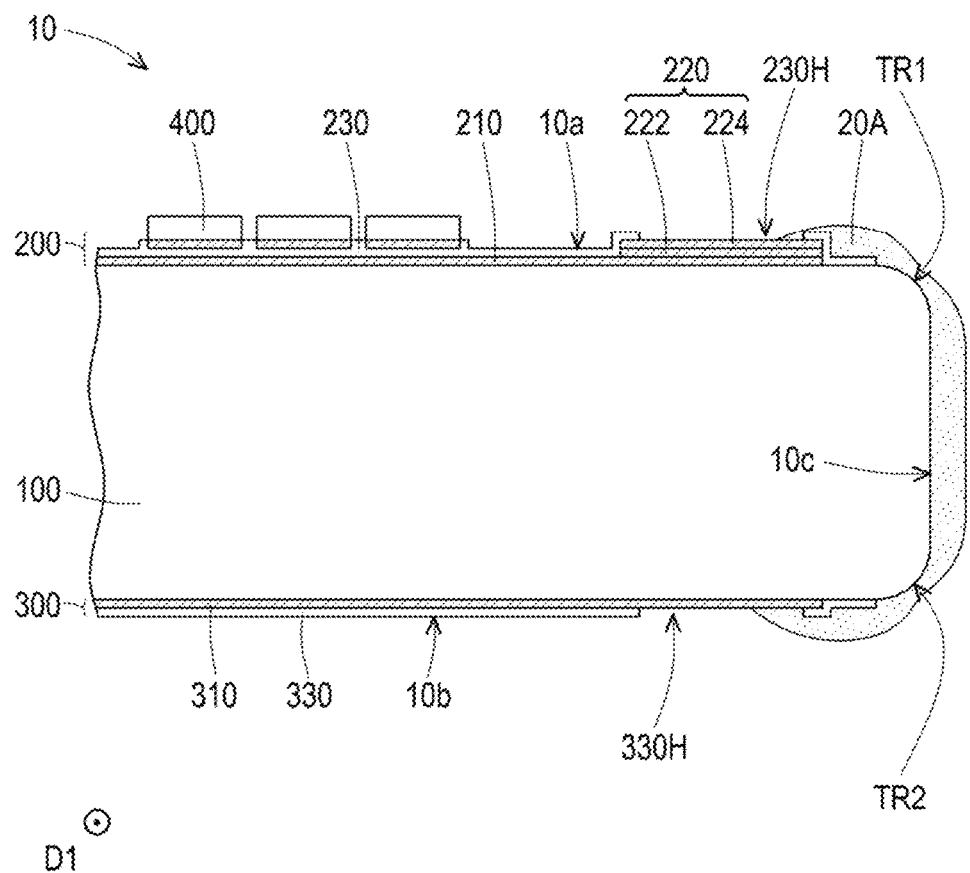
FIG. 7A and FIG. 8A are sectional schematic views of a circuit device according to one embodiment of the present disclosure.
Figure 7B:
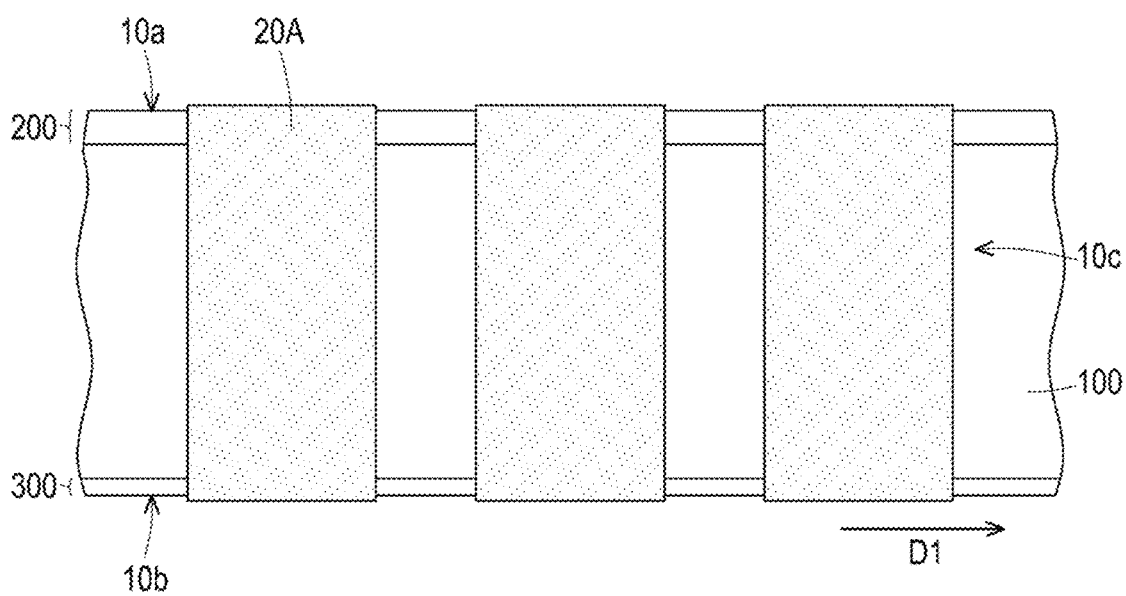
FIG. 7B and FIG. 8B are side schematic views of the circuit device in FIG. 7A and FIG. 8A.
Figure 8A:
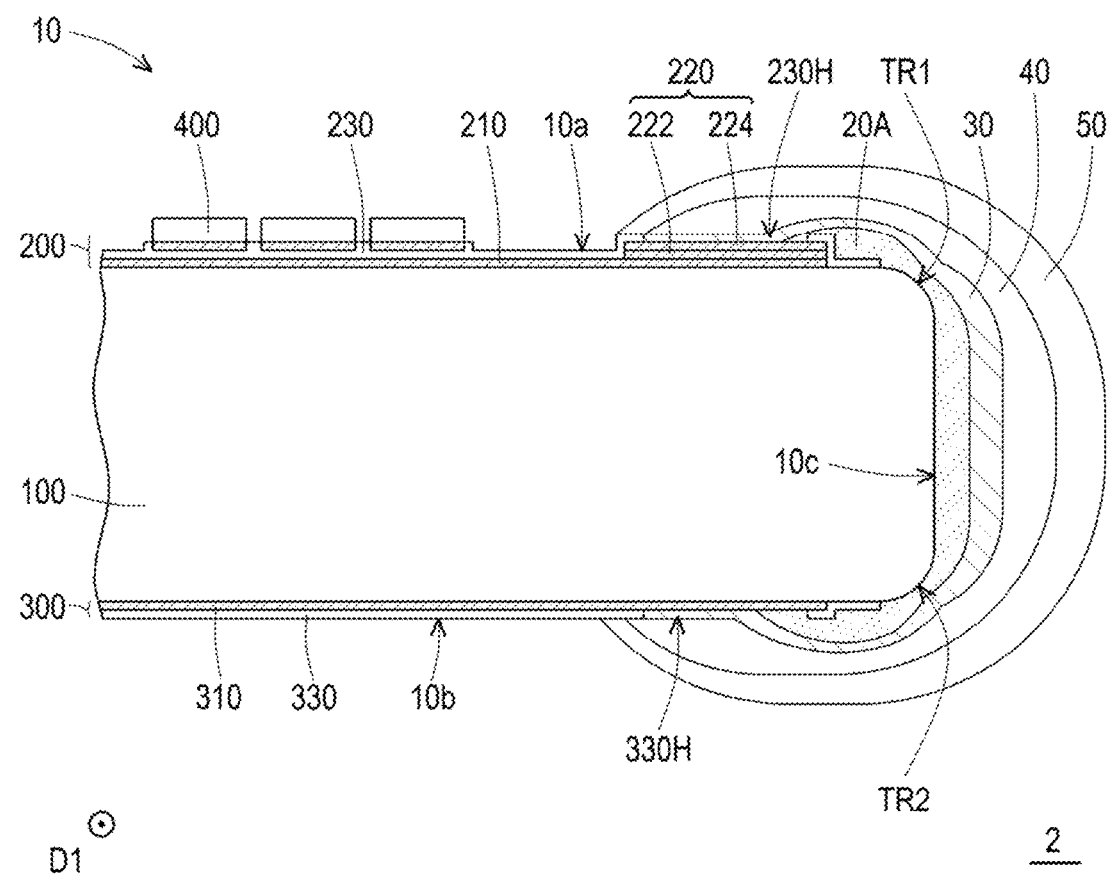
Figure 8B:
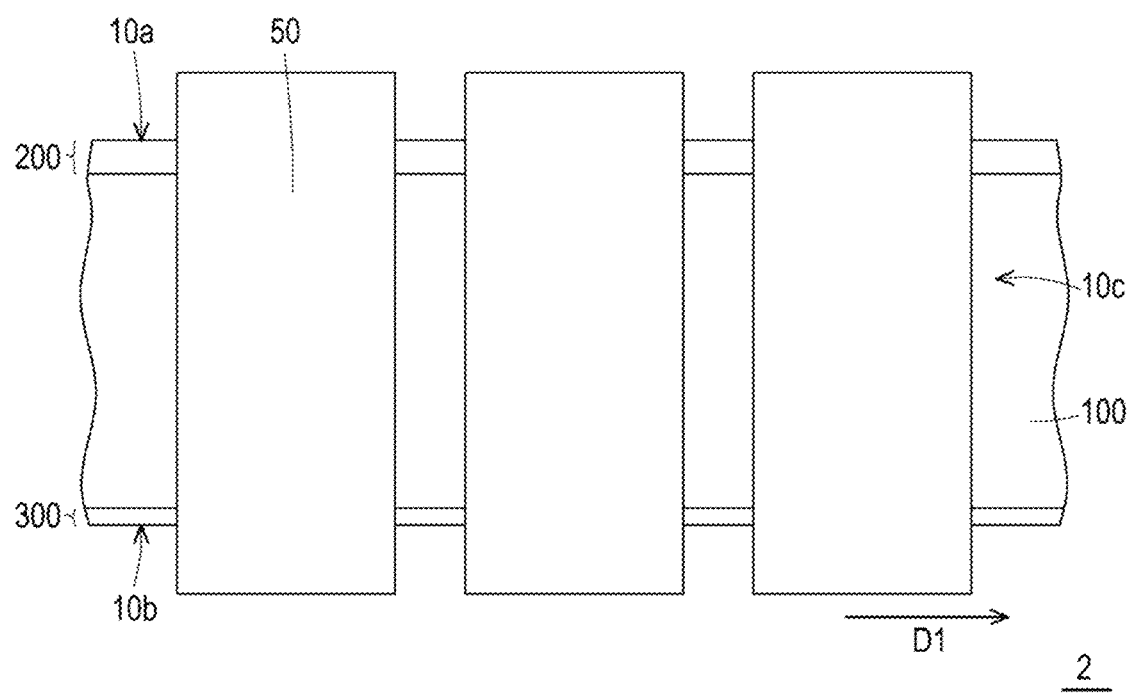

FIG. 7A and FIG. 8A are sectional schematic views of a circuit device according to one embodiment of the present disclosure. FIG. 7B and FIG. 8B are side schematic views of the circuit device in FIG. 7A and FIG. 8A. It should be noted that the embodiment of FIG. 7A to FIG. 8B utilizes the component reference numerals and certain contents of the embodiments of FIG. 1A to FIG. 6C, throughout which identical or similar reference numerals are used to represent identical or similar components, and descriptions of identical technical contents are omitted. The descriptions of the omitted contents may be referenced in the aforementioned embodiments, and are thus not hereinafter elaborated.

Referring to FIG. 7A and FIG. 8A, the protective layers 20A are formed on the circuit substrate 10. In the present embodiment, the protective layers 20A are formed on the circuit substrate 10. The protective layers 20A at least partially cover the first turning region TR1 and the second turning region TR2. In the present embodiment, a plurality of protective layers 20A are arranged in the first direction D1.

In the present embodiment, the protective layers 20A are separated from each other, and each protective layer 20A extends from the first turning region TR1 continuously to the second turning region TR2 along the side surface 10c of the circuit substrate 10. In certain embodiments, a material of the protective layers 20A is different from the material of the insulating structure 230 and the insulating structure 330, and the material of the protective layers 20A includes cured silver paste, epoxy resin or an acrylic-based insulating material.

In certain embodiments, the protective layers 20A cover a portion of the first circuit structure 200 and a portion of the second circuit structure 300. In the present embodiment, the protective layers 20A are filled in the corresponding openings 230H and/or the corresponding openings 330H, and contact the corresponding pads 220 and/or the corresponding signal lines 310. In other embodiments, the protective layers 20A are not filled in the openings 230H and the openings 330H.

In the present embodiment, the protective layers 20A cover the broken surface of the insulating structure 230

(referring to FIG. 1C), thus reducing the ill effect caused by the broken surface to the subsequent manufacturing process. In certain embodiments, the protective layers 20A are filled in the notch of the insulating structure 230 corresponding to the broken surface. In certain embodiments, the protective layers 20A extend from the upper surface of the insulating structure 230 to the carrier plate 100 along the broken surface, and the protective layers 20A contact the carrier plate 100.

In certain embodiments, the side surface 10c of the circuit substrate 10, the first turning region TR1 and the second turning region TR2 are formed by a grinding process. The grinding process may reduce the size of the border region of the circuit substrate 10, thus further reducing the size of the device. In certain embodiments, the grinding process makes the side surface 10c of the circuit substrate 10 (which may also be referred to as a side surface of a carrier plate 100) to generate a microcrack, such that the side surface of the carrier plate 100 is rougher than a front surface and a back surface of the carrier plate 100. In the present embodiment, the protective layers 20A cover the microcrack located on the side surface 10c of the circuit substrate 10, thus avoiding the ill effect caused by the microcrack to the subsequent manufacturing process.

Further referring to FIG. 8A and FIG. 8B, a manufacturing process similar to FIG. 3A to FIG. 6C is performed to form the side traces 30, the first covering layers 40 and the second covering layers 50. The side traces 30 are located on the protective layers 20A, and extend from the pads 220 across the side surface 10c of the circuit substrate 10 to the second surface 10b of the circuit substrate 10.

At this point, the circuit device 2 is substantially complete. The circuit device 2 includes the circuit substrate 10, the protective layers 20A, the side traces 30, the first covering layers 40 and the second covering layers 50.

FIG. 9 to FIG. 11B are scanning electron microscope images of a circuit device according to certain comparative embodiments of the present disclosure. It should be noted that the comparative embodiments of FIG. 9 to FIG. 11B utilize the component reference numerals and certain contents of the embodiments of FIG. 1A to FIG. 6C, throughout which identical or similar reference numerals are used to represent identical or similar components, and descriptions of identical technical contents are omitted. The descriptions of the omitted contents may be referenced in the aforementioned embodiments, and are thus not hereinafter elaborated.

Figure 9:
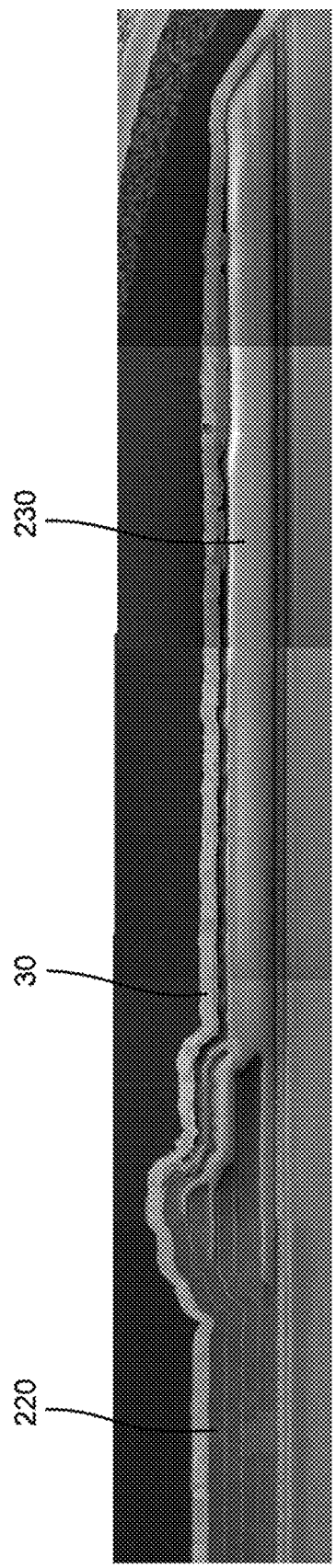
FIG. 9 is a scanning electron microscope image of a circuit device according to a first comparative embodiment of the present disclosure.

FIG. 9 is a scanning electron microscope image of a circuit device according to a first comparative embodiment of the present disclosure. Referring to FIG. 9, in the first comparative embodiment, there is no protective layer between the side traces 30 and the insulating structure 230. In the first comparative embodiment, the material of the side traces 30 includes copper, and the material of the insulating structure includes silicon nitride. Due to poor adhesion between copper and silicon nitride, the side traces 30 are prone to delamination issues.

Figure 10:
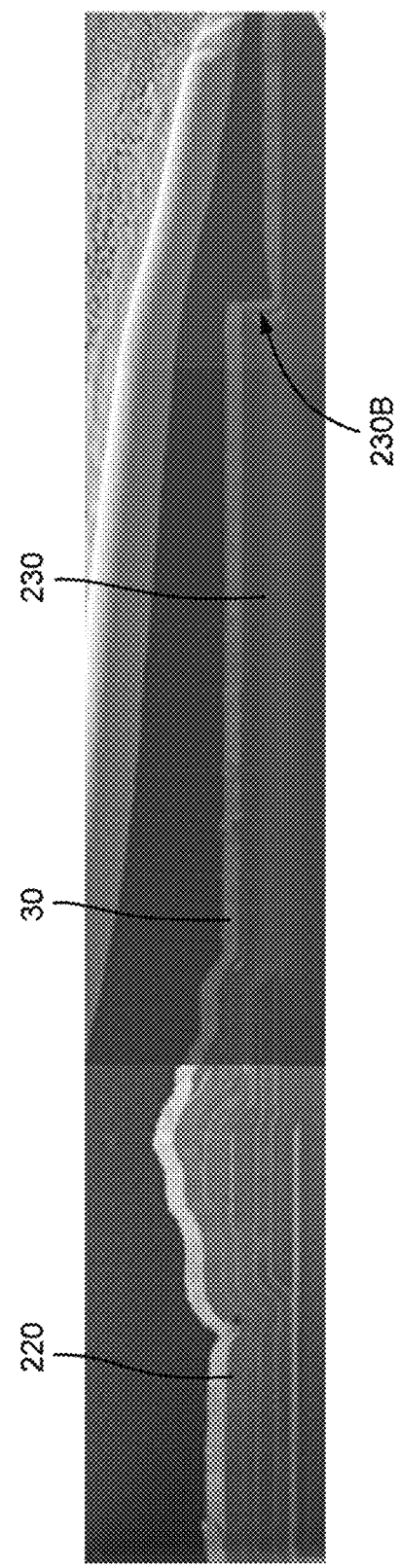
FIG. 10 is a scanning electron microscope image of a circuit device according to a second comparative embodiment of the present disclosure.

FIG. 10 is a scanning electron microscope image of a circuit device according to a second comparative embodiment of the present disclosure. Referring to FIG. 10, in the second comparative embodiment, there is no protective layer between the side traces 30 and the insulating structure 230. The insulating structure 230 has the broken surface 230B, and the side traces 30 are directly located on the broken surface 230B. The side traces 30 are prone to breakage due to the discontinuities at the broken surface 230B.

Figure 11A:
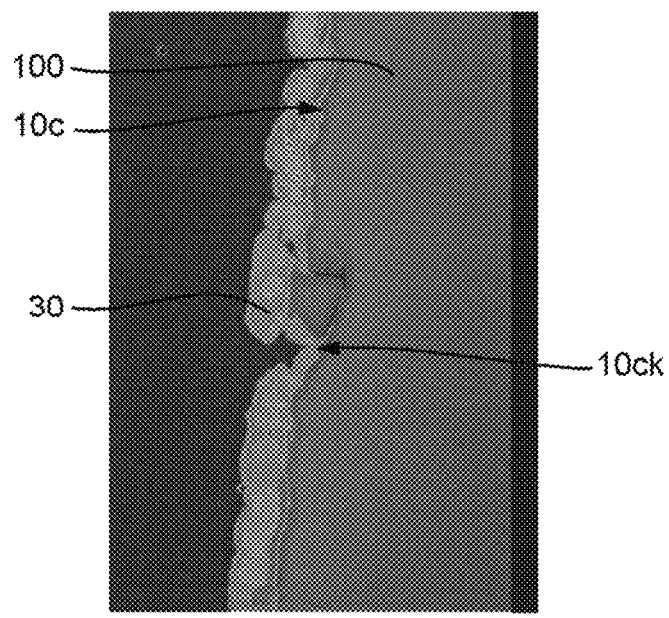
FIG. 11A and FIG. 11B are scanning electron microscope images of a circuit device according to a third comparative embodiment of the present disclosure.
Figure 11B:
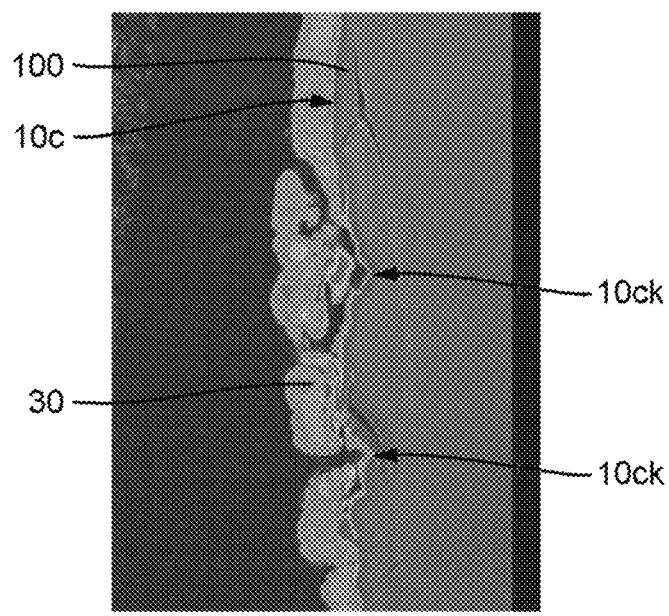

FIG. 11A and FIG. 11B are scanning electron microscope images of a circuit device according to a third comparative embodiment of the present disclosure. Referring to FIG. 11A and FIG. 11B, in the third comparative embodiment, there is no protective layer between the side traces 30 and the side surface 10c of the circuit substrate (or the side surface of the carrier plate 100). The side surface 10c includes a plurality of microcracks 10ck, and the microcracks 10ck may affect the yield of the side traces 30.

Figure 12:
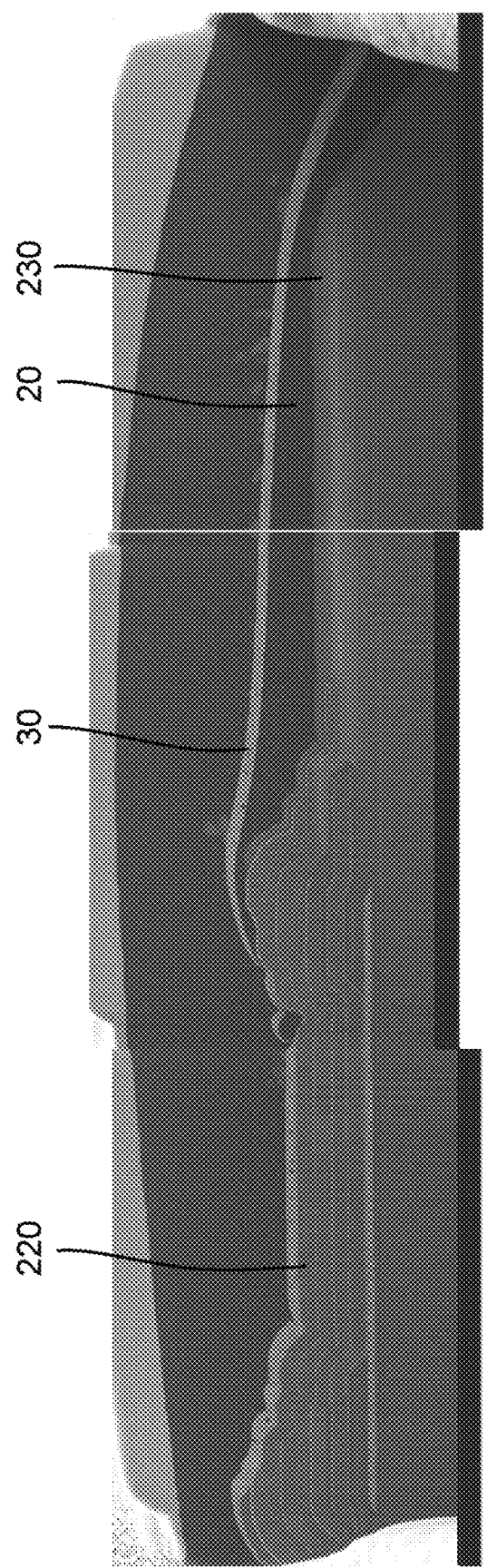
FIG. 12 is a scanning electron microscope image of a circuit device according to one embodiment of the present disclosure.

FIG. 12 is a scanning electron microscope image of a circuit device according to one embodiment of the present disclosure. It should be noted that the embodiment of FIG. 12 utilizes the component reference numerals and certain contents of the embodiments of FIG. 1A to FIG. 6C, throughout which identical or similar reference numerals are used to represent identical or similar components, and descriptions of identical technical contents are omitted. The descriptions of the omitted contents may be referenced in the aforementioned embodiments, and are thus not hereinafter elaborated. Referring to FIG. 12, the side traces 30 are located on the protective layers 20. Due to the good adhesion between the side traces 30 and the protective layers 20, the delamination issues of the side traces 30 may be improved.

In sum, in the circuit device of the present disclosure, the side trace is located on the protective layer, and the protective layer includes cured silver paste, epoxy resin or an acrylic-based insulating material. By providing the protective layer, the yield of the side trace may be enhanced.

The foregoing description of the exemplary embodiments of the invention has been presented only for the purposes of illustration and description and is not intended to be exhaustive or to limit the invention to the precise forms disclosed. Many modifications and variations are possible in light of the above teaching.

The embodiments were chosen and described in order to explain the principles of the invention and their practical application so as to activate others skilled in the art to utilize the invention and various embodiments and with various modifications as are suited to the particular use contemplated. Alternative embodiments will become apparent to those skilled in the art to which the present invention pertains without departing from its spirit and scope. Accordingly, the scope of the present invention is defined by the appended claims rather than the foregoing description and the exemplary embodiments described therein.

What is claimed is:
1. A circuit device, comprising:
a circuit substrate, having a first surface, a second surface opposite to the first surface, and a side surface, wherein a first turning region is provided between the first surface and the side surface, and a second turning region is provided between the second surface and the side surface, wherein the circuit substrate comprises:
a carrier plate; and
a first circuit structure, located on the carrier plate, and comprising a pad located on the first surface of the circuit substrate and an insulating structure surrounding the pad;
a protective layer, at least partially covering the first turning region and the second turning region, wherein a material of the protective layer comprises cured silver paste, epoxy resin or an acrylic-based insulating material; and
a side trace, located on the protective layer, and extending from the pad across the side surface of the circuit substrate to the second surface of the circuit substrate, wherein the insulating structure has an opening overlapping with the pad and a broken surface located between the pad and the side surface of the circuit substrate, the side trace is at least partially filled in the opening to contact the pad, and the protective layer covers the broken surface.

2. The circuit device according to claim 1, wherein the protective layer extends from an upper surface of the insulating structure to the carrier plate along the broken surface, and the protective layer contacts the carrier plate.

3. The circuit device according to claim 1, wherein the protective layer and the insulating structure include different materials.

4. The circuit device according to claim 1, wherein the protective layer extends from the first turning region continuously to the second turning region along the side surface of the circuit substrate.

5. The circuit device according to claim 4, wherein the side surface of the circuit substrate has a microcrack, and the protective layer covers the microcrack.

6. The circuit device according to claim 1, wherein the protective layer comprises a first portion and a second portion separated from each other, the first portion covers the first turning region, and the second portion covers the second turning region.

7. The circuit device according to claim 1, wherein the protective layer covers a portion of the first circuit structure.

8. The circuit device according to claim 1, further comprising:
   a first covering layer, covering the side trace, wherein a resistance of the first covering layer and the protective layer to an etching solution is greater than a resistance of the side trace to the etching solution, and the etching solution is configured to etch the side trace; and
   a second covering layer, covering the first covering layer.

9. The circuit device according to claim 1, comprising:
   a plurality of protective layers, at least partially covering the first turning region and the second turning region, wherein materials of the protective layers comprise cured silver paste, epoxy resin or acrylic-based insulating material, and the protective layers are separated from one another; and
   a plurality of side traces, each located on a corresponding one of the protective layers, wherein the side traces extend from a plurality of pads of the first circuit structure across the side surface of the circuit substrate to the second surface of the circuit substrate.

* * * * *